US009653345B1

(12) United States Patent
Chou et al.

(10) Patent No.: US 9,653,345 B1
(45) Date of Patent: May 16, 2017

(54) METHOD OF FABRICATING SEMICONDUCTOR STRUCTURE WITH IMPROVED CRITICAL DIMENSION CONTROL

(71) Applicant: UNITED MICROELECTRONICS CORP., Hsin-Chu (TW)

(72) Inventors: Shang-Nan Chou, Tainan (TW);
Che-Yi Lin, Kaohsiung (TW);
En-Chiuan Liou, Tainan (TW);
Yu-Ting Hung, Hsinchu (TW);
Shin-Feng Su, Tainan (TW);
Chia-Hsun Tseng, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/989,802

(22) Filed: Jan. 7, 2016

(51) Int. Cl.
*H01L 21/76* (2006.01)
*H01L 21/768* (2006.01)
*H01L 21/027* (2006.01)
*H01L 21/308* (2006.01)

(52) U.S. Cl.
CPC .... *H01L 21/76802* (2013.01); *H01L 21/0276* (2013.01); *H01L 21/308* (2013.01); *H01L 21/3081* (2013.01); *H01L 21/76832* (2013.01)

(58) Field of Classification Search
CPC .................................................. H01L 21/4763
USPC ....................................................... 438/421
See application file for complete search history.

(56) References Cited

U.S. PATENT DOCUMENTS

| | | | | |
|---|---|---|---|---|
| 6,426,298 B1* | 7/2002 | Chen | ................ | H01L 21/76808 257/E21.579 |
| 6,514,856 B2* | 2/2003 | Matsumoto | ....... | H01L 21/76808 257/E21.579 |
| 6,518,670 B1* | 2/2003 | Mandelman | ...... | H01L 21/76897 257/750 |
| 7,030,031 B2* | 4/2006 | Wille | ................ | H01L 21/31144 216/19 |
| 7,176,123 B2* | 2/2007 | Kim | .................. | H01L 21/76808 257/E21.579 |
| 7,253,112 B2* | 8/2007 | Ho | .................... | H01L 21/76808 257/E21.579 |
| 7,396,749 B2* | 7/2008 | Dittmar | ............ | H01L 21/76804 257/E21.23 |
| 7,501,340 B2* | 3/2009 | Koh | .................... | H01L 21/2885 257/E21.579 |
| 8,592,321 B2 | 11/2013 | Chang | | |

(Continued)

*Primary Examiner* — Caleb Henry
(74) *Attorney, Agent, or Firm* — Winston Hsu; Scott Margo (57) ABSTRACT

A method of fabricating a semiconductor structure for improving critical dimension control is provided in the present invention. The method includes the following steps. An inter metal dielectric (IMD) layer is formed on a semiconductor substrate, a patterned hard mask layer is formed on the IMD layer, and a first aperture is formed in the IMD layer. A first barrier layer is formed on the patterned hard mask layer and a surface of the first aperture, a first patterned resist is formed on the first barrier layer, and an etching process is performed to form a second aperture in the IMD layer by using the first patterned resist as a mask. The first patterned resist is kept from being poisoned because of the first barrier layer, and the critical dimension control of the semiconductor structure may be improved accordingly.

15 Claims, 12 Drawing Sheets

(56) References Cited

U.S. PATENT DOCUMENTS

| | | | |
|---|---|---|---|
| 8,822,333 B2* | 9/2014 | Zhou | H01L 21/76843 438/653 |
| 8,835,324 B2 | 9/2014 | Chen | |
| 8,916,475 B1 | 12/2014 | Chen | |
| 2003/0087514 A1* | 5/2003 | Tang | H01L 21/76808 438/630 |
| 2005/0285222 A1* | 12/2005 | Thei | H01L 23/5256 257/529 |
| 2007/0020565 A1 | 1/2007 | Koh | |
| 2007/0072334 A1* | 3/2007 | Orlowski | H01L 21/76808 438/95 |
| 2007/0249156 A1* | 10/2007 | Bonilla | H01L 21/02074 438/622 |
| 2007/0259291 A1* | 11/2007 | Bucchignano | H01L 21/31144 430/313 |
| 2008/0026568 A1* | 1/2008 | Standaert | H01L 21/76805 438/638 |
| 2008/0057701 A1* | 3/2008 | Engbrecht | H01L 21/0276 438/624 |
| 2008/0166870 A1* | 7/2008 | Huang | H01L 21/0217 438/619 |
| 2011/0183525 A1* | 7/2011 | Purushothaman | H01L 21/02203 438/778 |
| 2012/0329273 A1* | 12/2012 | Bruce | H01L 21/02203 438/653 |

\* cited by examiner

FIG. 12

METHOD OF FABRICATING SEMICONDUCTOR STRUCTURE WITH IMPROVED CRITICAL DIMENSION CONTROL

BACKGROUND OF THE INVENTION

1. Field of the Invention

The present invention relates to a method of fabricating a semiconductor structure, and more particularly, to a method of fabricating a semiconductor structure for preventing a patterned resist from being poisoned and improving the control of the critical dimension.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly.

In conventional methods of forming contact holes, a photo resist layer serves as an etching mask for etching the underlying interlayer dielectric layer. However, as the density of semiconductor devices on a wafer is increasing, the intervals between the devices are becoming shorter and shorter, and it becomes more difficult to form the contact holes because of the exposure resolution limitation. Accordingly, the current solution is to use a double-exposure patterning technology to create desired contact holes. In the double-exposure patterning technology, the photo resist of the second lithographic process tends to be poisoned and/or contaminated by compositions of other material layers exposed by the first lithographic process, and the critical dimension of the second lithographic process may be affected accordingly.

SUMMARY OF THE INVENTION

According to the claimed invention, a method of fabricating a semiconductor structure is provided. The method includes the following steps. An inter metal dielectric (IMD) layer is formed on a semiconductor substrate. A patterned hard mask layer is formed on the IMD layer. A first aperture is formed in the IMD layer. A first barrier layer is formed on the patterned hard mask layer and a surface of the first aperture. A first patterned resist is formed on the first barrier layer. An etching process is performed to form a second aperture in the IMD layer by using the first patterned resist as a mask.

According to the method of fabricating the semiconductor structure in the present invention, the first barrier layer is formed to cover the patterned hard mask layer and the first aperture, and the first patterned resist for forming the second aperture in the IMD layer may be kept from being poisoned and/or contaminated by the patterned hard mask layer and/or other material layer exposed by the first aperture. The critical dimension (CD) control of the semiconductor structure may be improved accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-10 are schematic drawings illustrating a method of fabricating a semiconductor structure according to a first embodiment of the present invention, wherein

DETAILED DESCRIPTION

Figure 1:
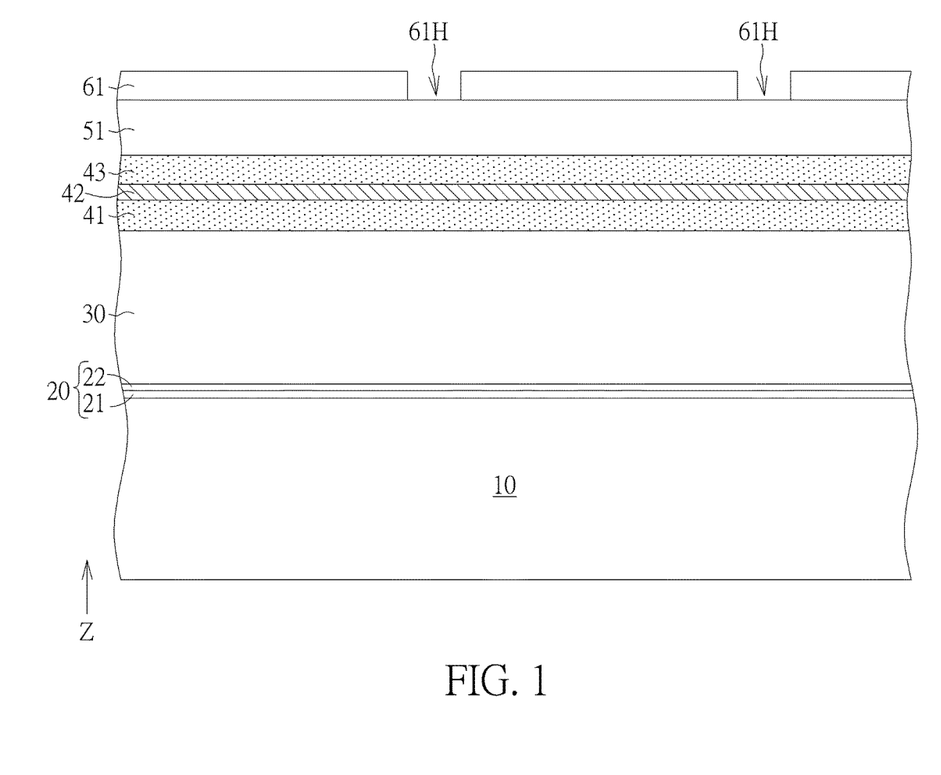

Please refer to FIGS. 1-10. FIGS. 1-10 are schematic drawings illustrating a method of fabricating a semiconductor structure according to a first embodiment of the present invention. The method of fabricating the semiconductor structure in this embodiment includes the following steps. As shown in FIG. 1, a semiconductor substrate 10 is provided. The semiconductor substrate 10 may include silicon substrate, epitaxial substrate, silicon carbide substrate, or silicon-on-insulator (SOI) substrate, but not limited thereto. A standard metal-oxide semiconductor (MOS) transistor process may be performed to form at least one MOS transistor (not shown) or other semiconductor devices on the semiconductor substrate 10. The MOS transistor could be a PMOS transistor, a NMOS transistor, or a CMOS transistor, and the MOS transistor could also include typical transistor structures including a gate structure, a spacer, a lightly doped drain, source/drain regions and/or salicides. The gate structure may be a polysilicon gate or a metal gate formed by high-k first or high-k last processes. As these processes are well known to those skilled in the art, the details of which are omitted herein for sake of brevity.

An inter metal dielectric (IMD) layer 30 is then formed on the semiconductor substrate 10. The IMD layer 30 may include an ultra-low dielectric constant (ULK) dielectric layer such as porous dielectric material, SiC, SiON, or combination thereof, but not limited thereto. In this embodiment, an etching stop layer 20 may be formed on the semiconductor substrate 10 before the step of forming the IMD layer 30. The etching stop layer 20 may be a single layer or a multiple layer structure. For example, the etching stop layer 20 may include a nitrogen doped carbide (NDC) layer 21 and a tetraethylorthosilicate (TEOS) layer 22, but not limited thereto. Accordingly, the IMD layer 30 is formed on the etching stop layer 20. A sacrifice layer 41 is formed on the IMD layer 30, a hard mask layer 42 is formed on the sacrifice layer 41, and a cap layer 43 is formed on the hard mask layer 42. In this embodiment, the sacrifice layer 41 and the cap layer 43 may include silicon oxide, silicon carbide, silicon oxynitride (SiON), silicon oxycarbide (SiOC), or other suitable materials. The hard mask layer 42 may include a metal layer such as titanium nitride (TiN), a carbon containing material such as amorphous carbon, or other suitable hard mask materials. A bottom anti-reflective coating (BARC) 51 is formed on the cap layer 43, and a patterned resist 61 is formed on the BAC 51.

Figure 2:
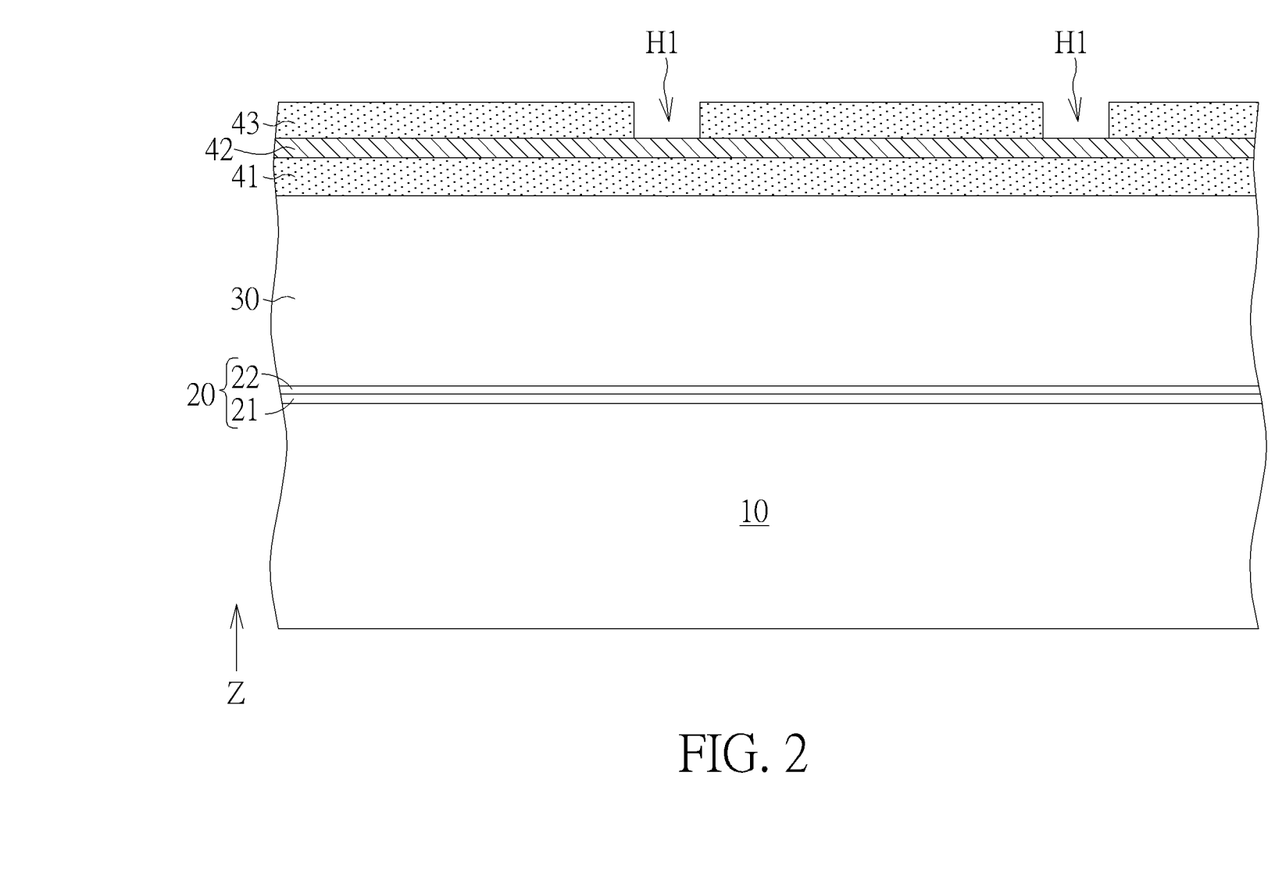
FIG. 2 is a schematic drawing in a step subsequent to FIG. 1.
Figure 3:
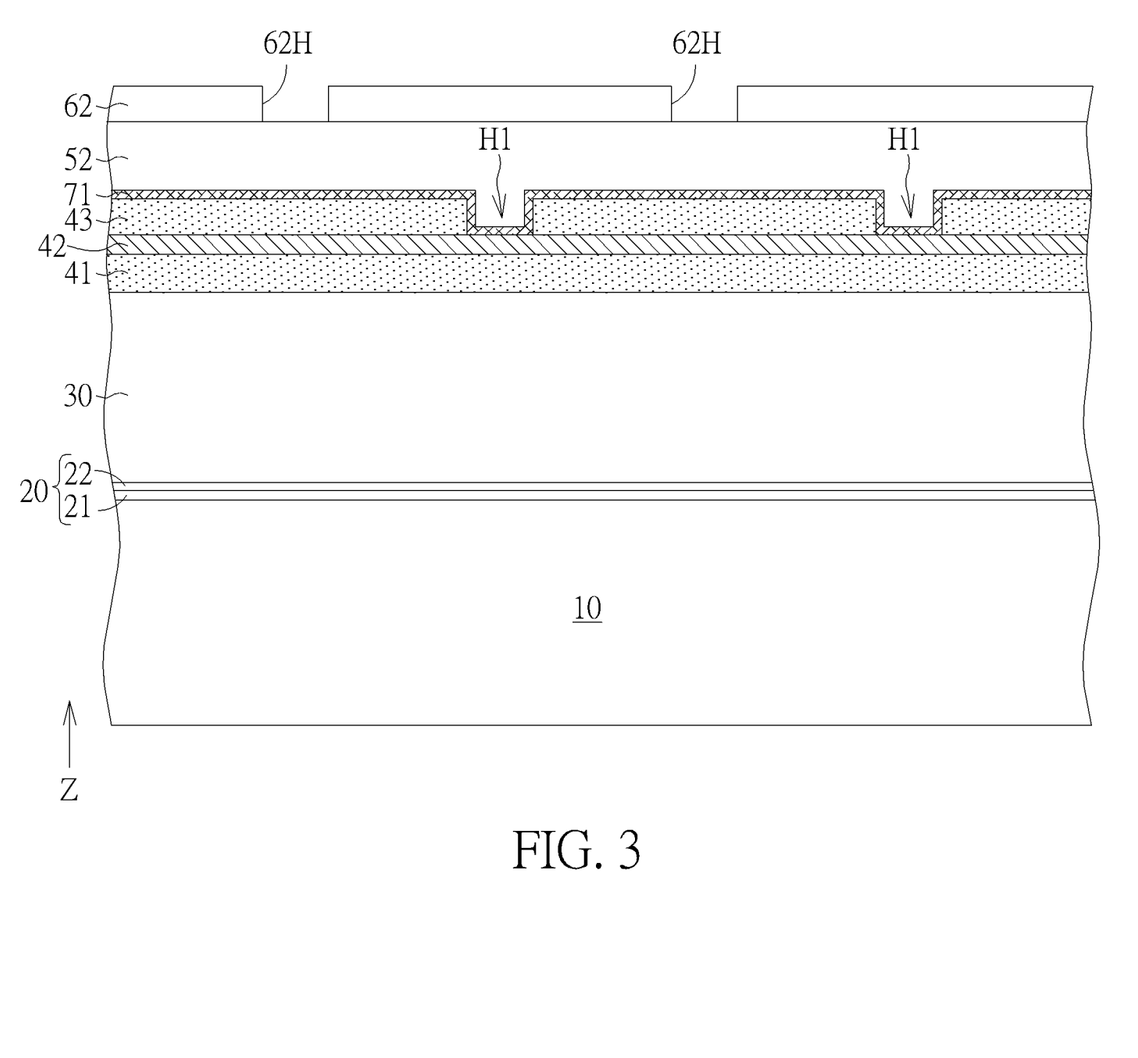
FIG. 3 is a schematic drawing in a step subsequent to FIG. 2.

As shown in FIGS. 1-5, a plurality of trenches T are formed in the hard mask layer 42 for forming a patterned hard mask layer 42P on the IMD layer 30. The method of forming the patterned hard mask layer 42P may include but is not limited to the following steps. As shown in FIG. 1 and FIG. 2, a plurality of first openings H1 corresponding to holes 61 in the patterned resist 61 may be formed in the cap layer 43 by an etching process. The BARC 51 and the patterned resist 61 are removed after the etching process. The first openings H1 expose a part of the hard mask layer 42. As shown in FIG. 3, a BARC (such as a second BARC 52 shown in FIG. 3) is formed on the cap layer 43, and a patterned resist (such as a second patterned resist 62 shown in FIG. 3) is then formed on the second BARC 52. It is worth noting that, before the step of forming the second BARC 52, a barrier layer (such as a second barrier layer 71 shown in FIG. 3) may be formed conformally on the cap layer 43 and the hard mask layer 42 exposed by the first openings H1, and the second BARC 52 is formed on the second barrier layer 71. The second barrier layer 71 may include a nitrogen-free material layer such as a nitrogen-free silicon oxide layer, and the second barrier layer 71 may be formed by atomic layer deposition (ALD), but not limited thereto. The second barrier layer 71 covers the cap layer 43 and the surface of the first openings H1 for keeping the second patterned resist 62 from being poisoned and/or contaminated by compositions such as nitrogen in the cap layer 43 and/or the hard mask layer 42. In other words, the second barrier layer 71 may be used to keep the nitrogen in the cap layer 43 and/or the hard mask layer 42 from infiltrating into the second patterned resist 62.

Figure 4:
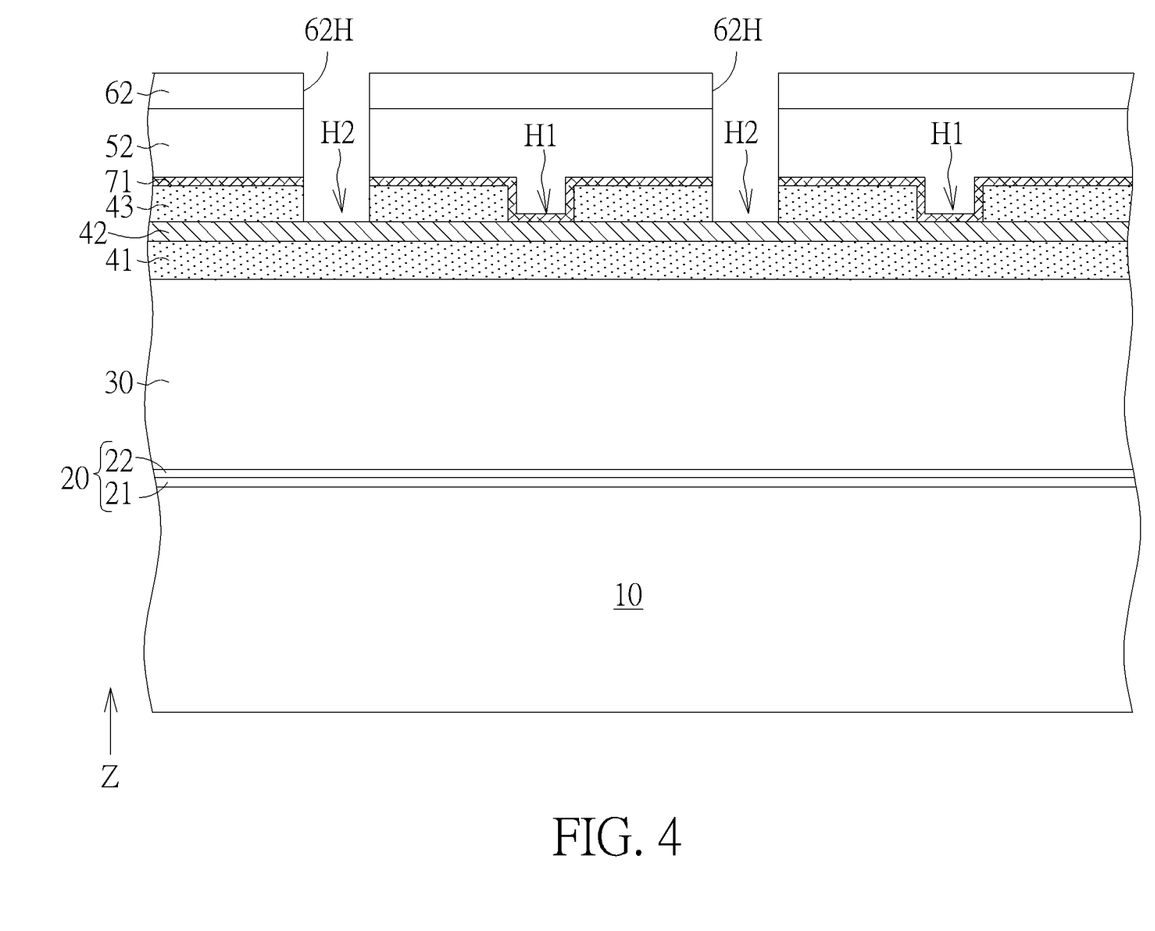
FIG. 4 is a schematic drawing in a step subsequent to FIG. 3.
Figure 5:
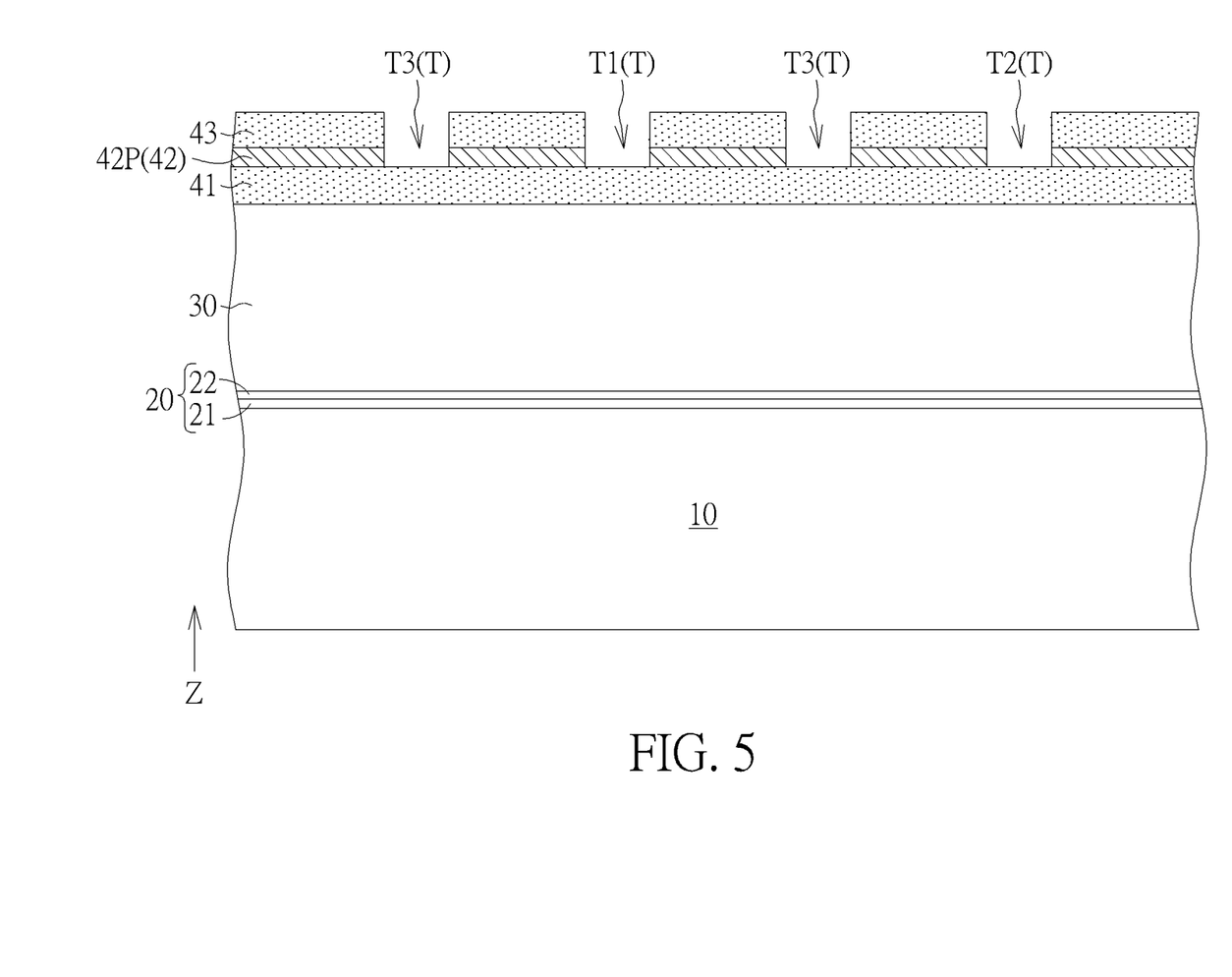
FIG. 5 is a schematic drawing in a step subsequent to FIG. 4.

As shown in FIG. 3 and FIG. 4, the second patterned resist 62 includes a plurality of holes 62H, and the holes 62H do not overlap the first openings H1 preferably. A plurality of second openings H2 corresponding to holes 62 in the second patterned resist 62 may be formed in the cap layer 43 by using the second patterned resist 62 as a mask in another etching process. In other words, the second openings H2 are formed in the cap layer 43 after the step of forming the first openings H1, and the second openings H2 expose another part of the hard mask layer 42. The second barrier layer 71 covers the cap layer 43 and the hard mask layer 42 exposed by the first openings H1 during the step of forming the second BARC 52, the step of forming the second patterned resist 62, and the step of forming the second openings H2. The second patterned resist 62 may be kept from being poisoned by the compositions in the cap layer 43 and/or the hard mask layer 42 accordingly. As shown in FIG. 4 an FIG. 5, the second BARC 52 and the second patterned resist 62 are removed after the etching process. The first openings H1 and the second openings H2 are transferred to the hard mask layer 42 for forming a plurality of the trenches T by an etching process. The second barrier layer 71, the second BARC 52, and the second patterned resist 62 may be removed after the step of forming the second openings H2 and before the step of forming the trenches Tin the hard mask layer 42. Each of the trenches T in the patterned hard mask layer 42P exposes a part of the sacrifice layer 41.

Figure 6:
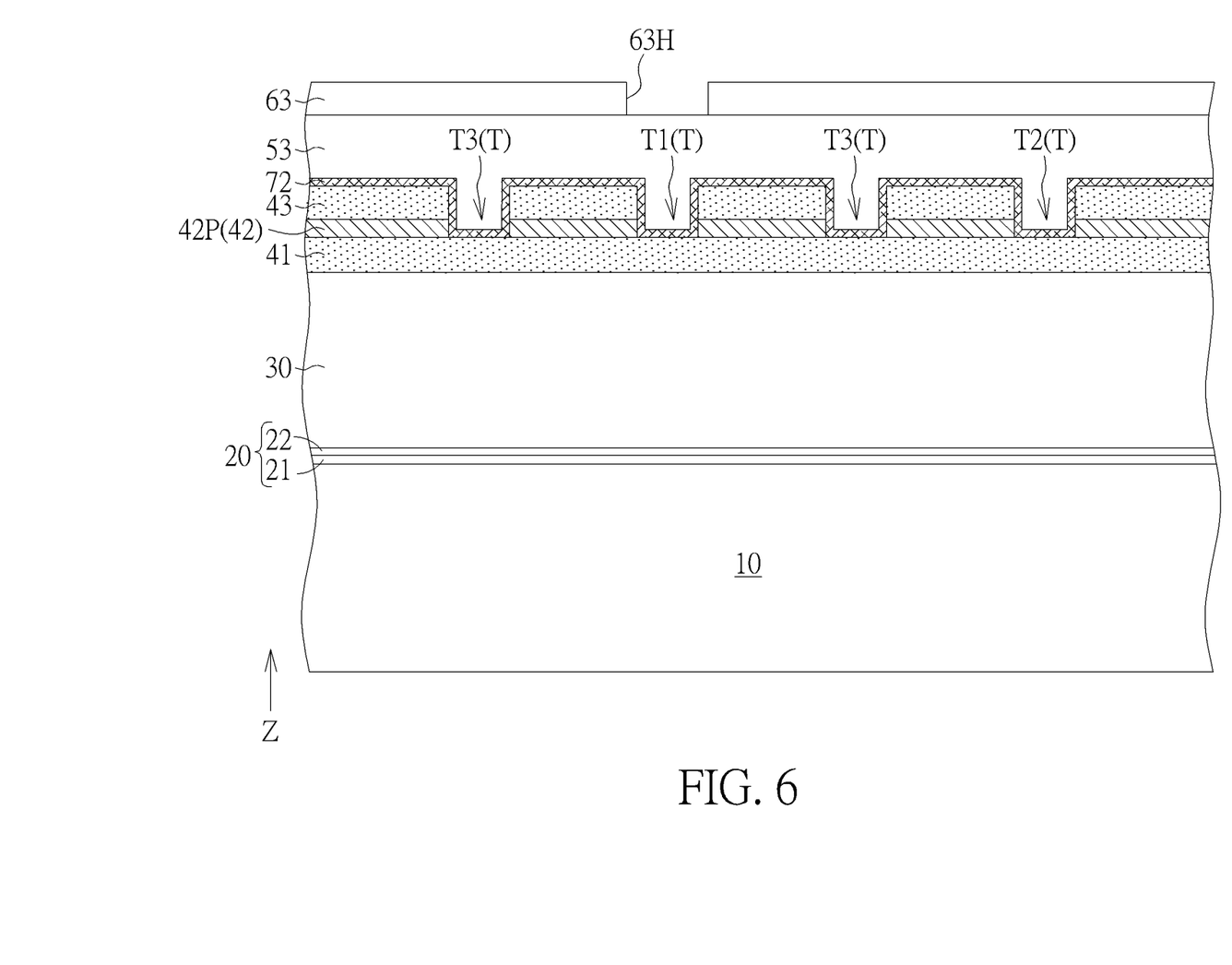
FIG. 6 is a schematic drawing in a step subsequent to FIG. 5.
Figure 7:
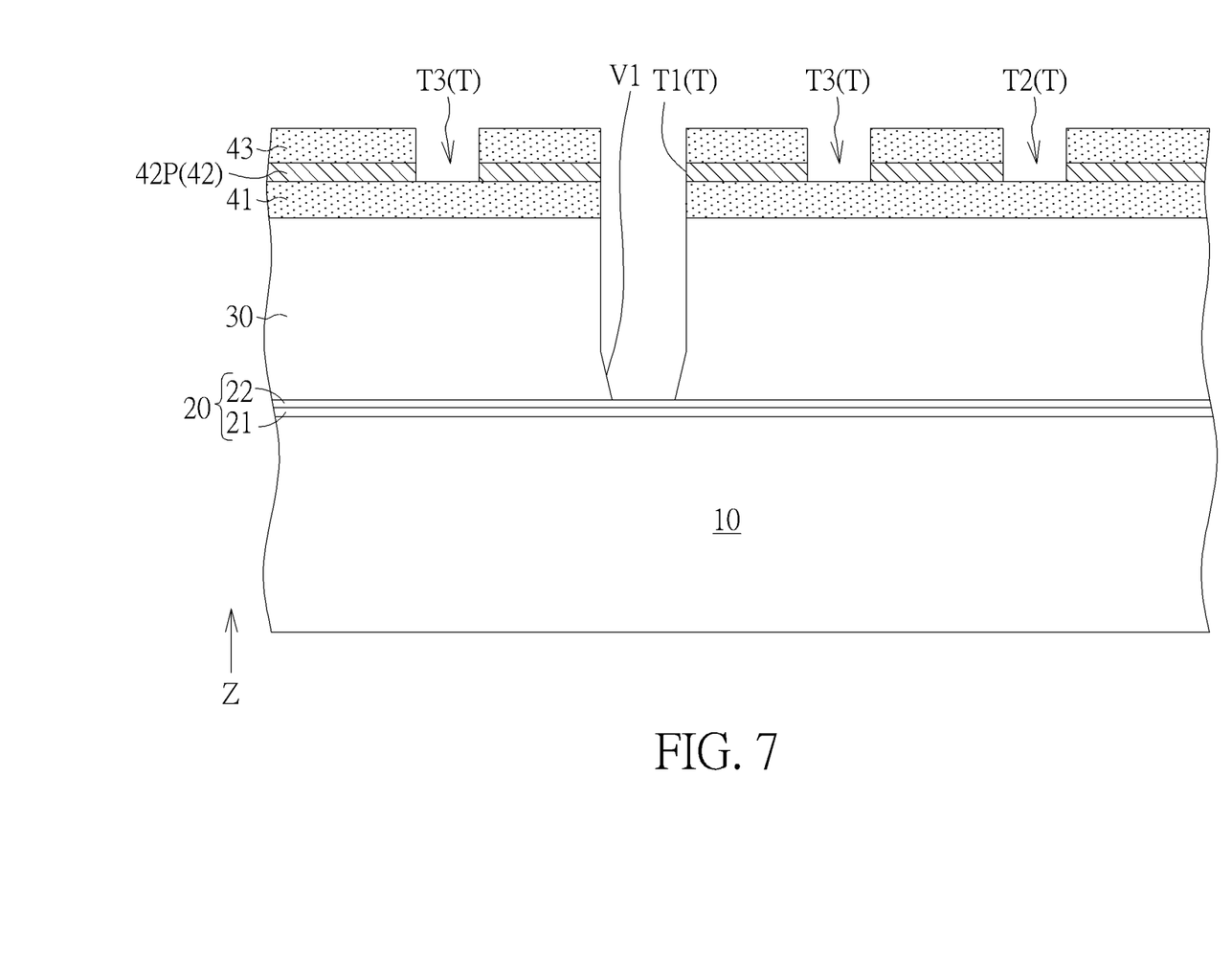
FIG. 7 is a schematic drawing in a step subsequent to FIG. 6.

As shown in FIG. 6, a BARC 53 and a patterned resist 63 including a hole 63H are formed on the cap layer 43 and the sacrifice layer 41 exposed by the trenches T. It is worth noting that another barrier layer (such as a third barrier layer 72 shown in FIG. 6) may be formed conformally on the cap layer 43 and the surfaces of the trenches T before the step of forming the BARC 53, and the third barrier layer 72 may be used to keep the patterned resist 63 from being poisoned by the compositions in the cap layer 43, the patterned hard mask layer 42, and/or the sacrifice layer 41. The material properties of the third barrier layer 72 are similar to those of the second barrier layer mentioned above. The hole 63H may overlap one of the trenches T in a vertical direction Z, and a width of the hole 63H is larger than a width of the corresponding trench T preferably, but not limited thereto. For example, the trenches T in the patterned hard mask layer 42P may include a first trench T1, a second trench T2, and a third trench T3. The first trench T1, the second trench T2, and the third trench T3 expose different parts of the sacrifice layer 41 respectively. As shown in FIG. 6 and FIG. 7, the hole 63H in the patterned resist 63 is formed corresponding to the first trench T1, and a first aperture V1 is formed in the IMD layer 30 by using the patterned resist 63 in an etching process. The BARC 53, the patterned resist 63, and the third barrier layer 72 may be removed after the etching process for forming the first aperture V1 in this embodiment, but the present invention is not limited to this. In other embodiments of the present invention, the third barrier layer 72 may be kept in the successive processes such as a process of forming another BARC and another patterned resist and/or an etching process of forming another aperture in the IMD layer.

Figure 8:
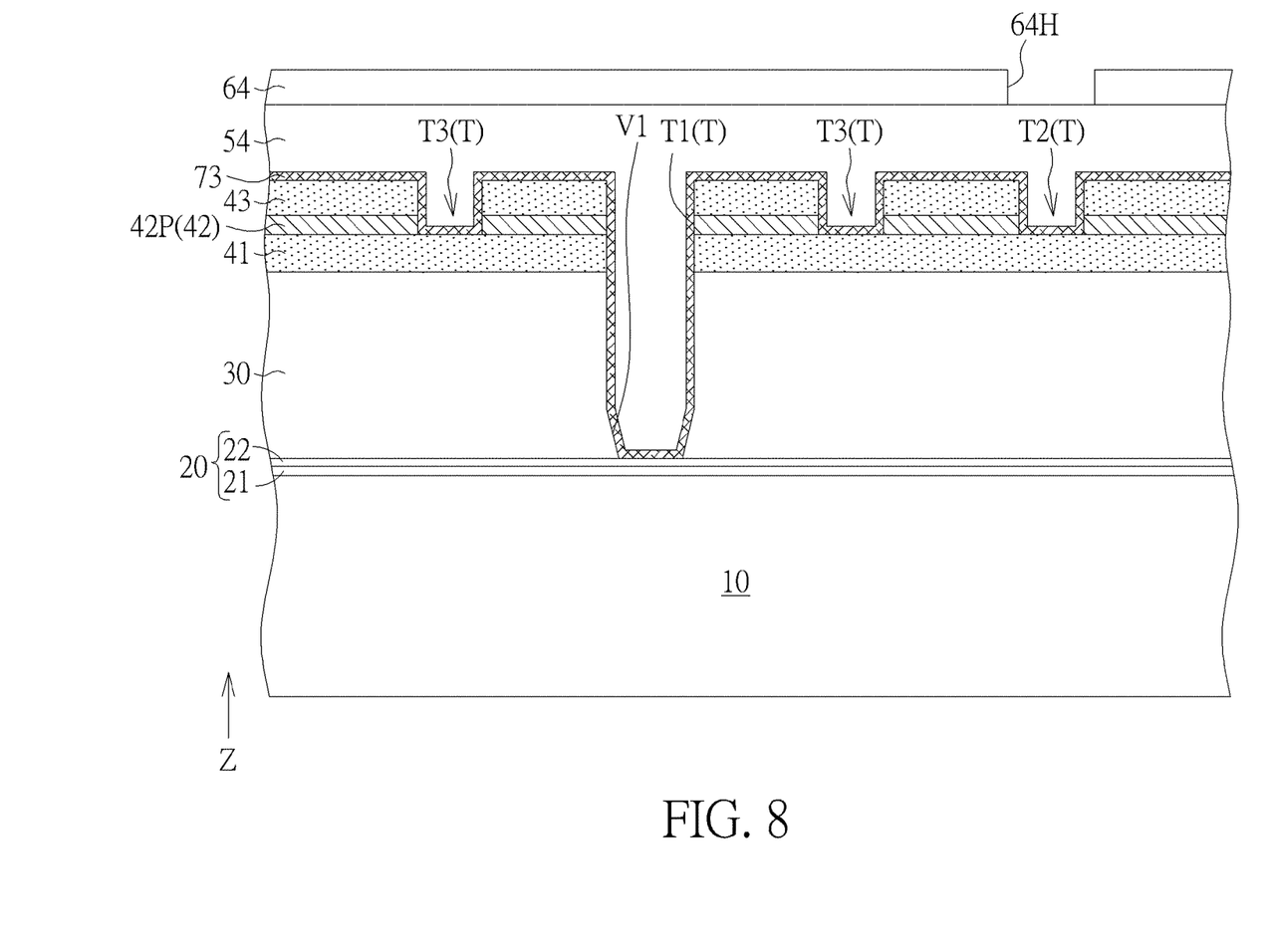
FIG. 8 is a schematic drawing in a step subsequent to FIG. 7.

As shown in FIG. 6 and FIG. 7, the cap layer 43 is formed on the patterned hard mask layer 42P before the step of forming the first aperture V1, and the sacrifice layer 41 is formed between the IMD layer 30 and the patterned hard mask layer 42P. The first aperture V1 in this embodiment penetrates the sacrifice layer 41 and the IMD layer 30, and a part of the etching stop layer 20 is exposed by the first aperture V1, but the present invention is not limited to this. In other embodiments of the present invention, the first aperture V1 may stop in the IMD layer 30 without exposing the etching stop layer 20. Accordingly, the surface of the first aperture V1 in this embodiment may include a part of the surface of the sacrifice layer 41, a part of the surface of the IMD layer, and a part of the surface of the etching stop layer 20, but not limited thereto. As shown in FIG. 8, a first barrier layer 73 is formed on the patterned hard mask layer 42P and the surface of the first aperture V1, and a first patterned resist 64 is formed on the first barrier layer 73. Specifically, the first barrier layer 73 may be conformally formed on the cap layer, the patterned hard mask layer 42P, the sacrifice layer 41, and the surface of the first aperture V1, and a first bottom anti-reflection coating (BARC) 54 may be selectively formed on the first barrier layer 73 before the step of forming first patterned resist 64. In this embodiment, the first aperture V1 is filled with the first barrier layer 73 and the first BARC 54, and the first patterned resist 64 is formed on the first BARC 54.

Figure 9:
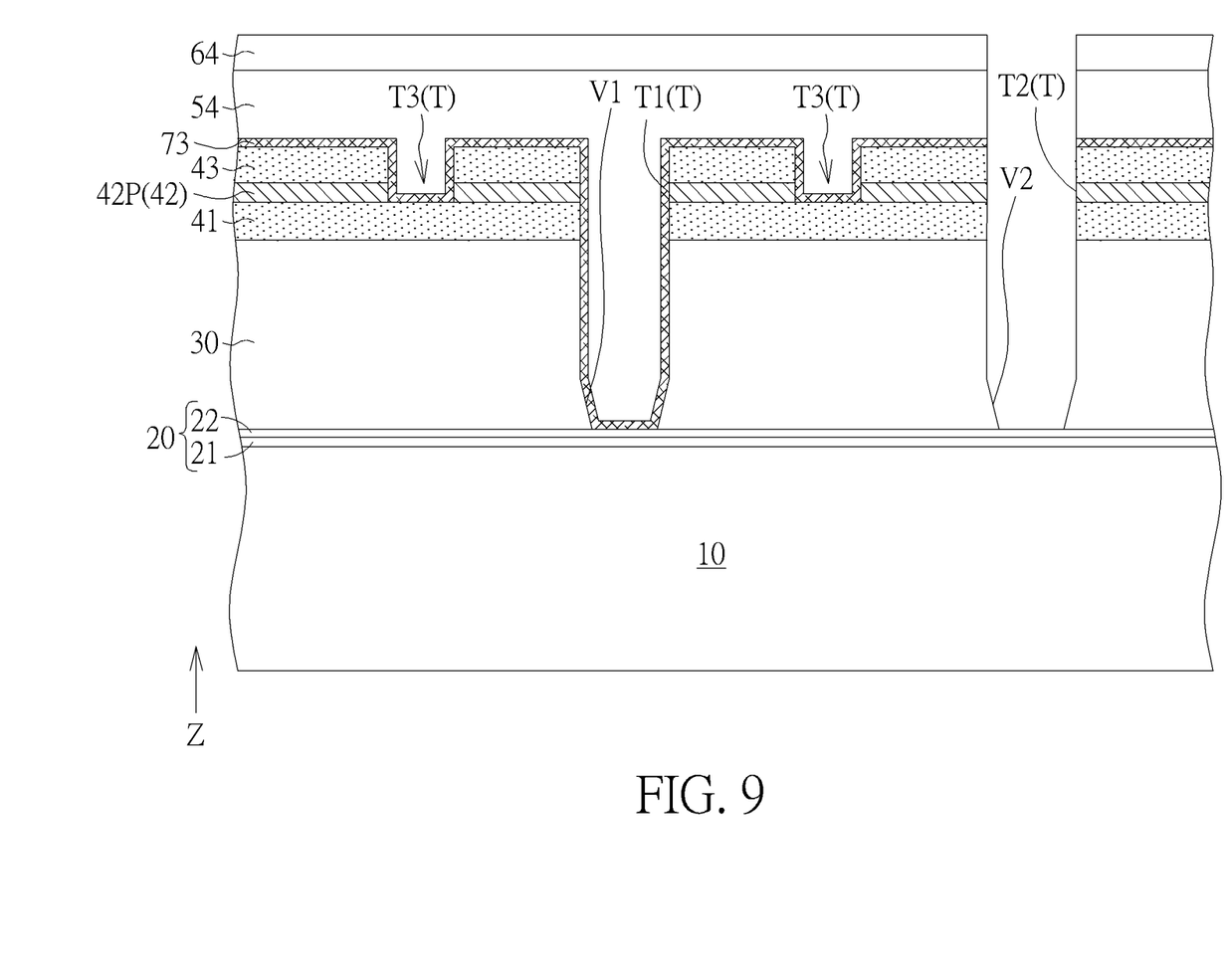
FIG. 9 is a schematic drawing in a step subsequent to FIG. 8.

As shown in FIG. 8, the first patterned resist 64 includes a hole 64H corresponding to one of the trenches T such as the second trench T2 in the patterned hard mask layer 42P. The hole 64H may overlap the second trench T2 in the vertical direction Z, and a width of the hole 64H is larger than a width of the second trench T2 preferably, but not limited thereto. As shown in FIG. 9, an etching process is then performed to form a second aperture V2 in the IMD layer 30 by using the first patterned resist 64 as a mask. The first barrier layer 73 covers the cap layer 43, the patterned hard mask layer 42P, and the first aperture V1 during the step of forming the first BARC 54, the step of forming the first patterned resist 64, and the etching process for forming the second aperture V2, and the first barrier layer 73 may be used to keep the first patterned resist 64 from being poisoned and/or contaminated by the compositions such as nitrogen in the cap layer 43, the patterned hard mask layer 42P, the sacrifice layer 41, the IMD layer 30, and/or the etching stop layer 20. In other words, the first barrier layer 73 may be used to keep the nitrogen from infiltrating into the first patterned resist 64. The first barrier layer 73 may include a nitrogen-free material layer such as a nitrogen-free silicon oxide layer, and the first barrier layer 73 may be formed by atomic layer deposition, but not limited thereto. In this embodiment, the second aperture V2 also penetrates the sacrifice layer 41 and the IMD layer 30, and another part of the etching stop layer 20 is exposed by the second aperture V2, but the present invention is not limited to this. In other embodiments of the present invention, the second aperture V2 may stop in the IMD layer 30 without exposing the etching stop layer 20. In this embodiment, the first aperture V1 is formed corresponding to a portion of one of the trenches T in the patterned hard mask layer 42P (such as the first trench T1), and the second aperture V2 is formed corresponding to a portion of another one of the trenches T (such as the second trench T2).

Figure 10:
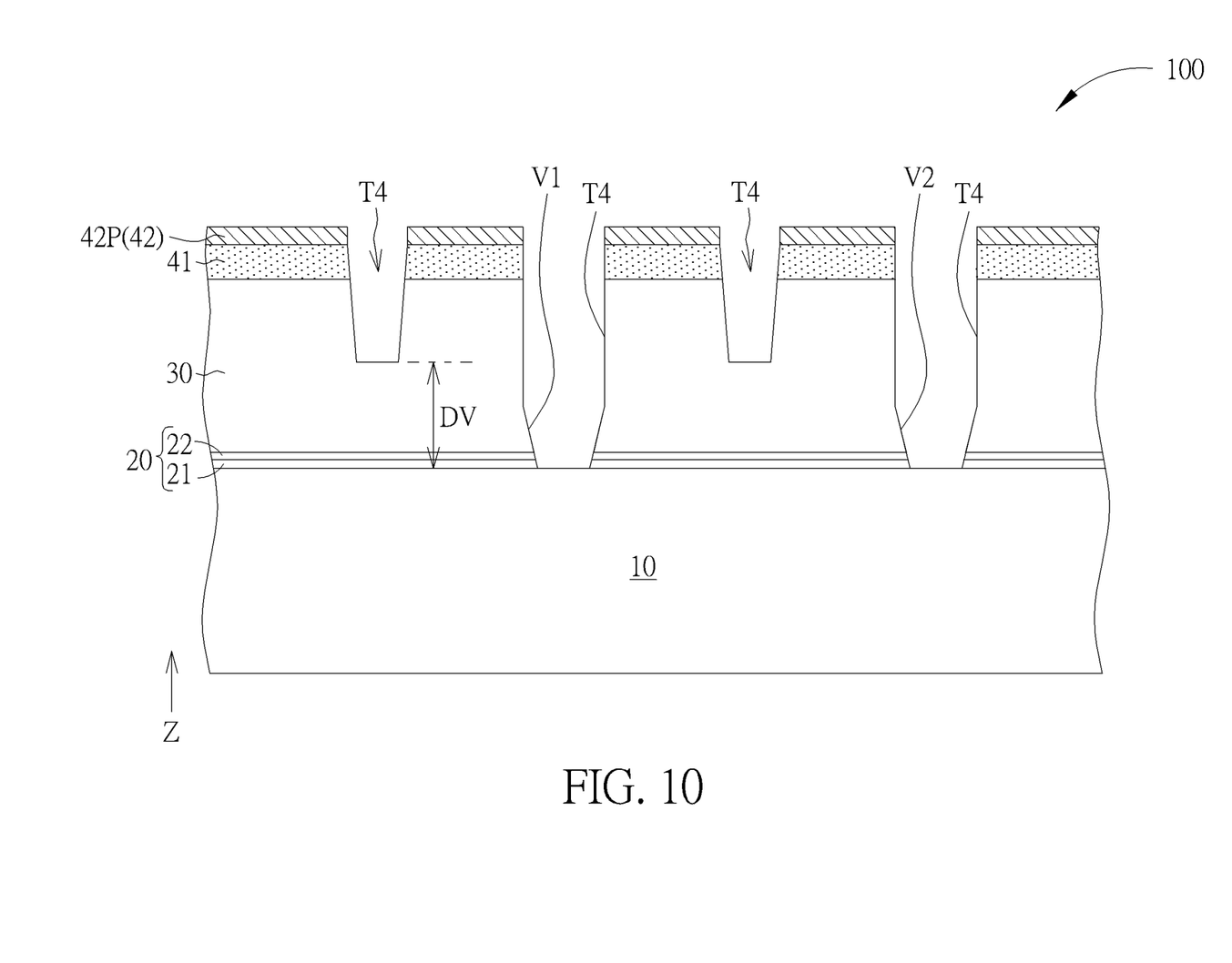
FIG. 10 is a schematic drawing in a step subsequent to FIG. 9.

As shown in FIG. 9 and FIG. 10, the first aperture V1 and the second aperture V2 are transferred to the etching stop layer 20 by an etching process, and the trenches T in the patterned hard mask layer 42P are also transferred to the sacrifice layer 41 and the IMD layer 30 for forming a plurality of fourth trenches T4 in the IMD layer 30. The fourth trenches T4 do not penetrate the IMD layer 30 preferably. The first patterned resist 64, the first BARC 54, the first barrier layer 73, and the cap layer 43 may be removed after the step of forming the second aperture V2 and before the step of transferring the first aperture V1 and the second aperture V2 to the etching stop layer 20. In other words, in this embodiment, the first aperture V1 and the second aperture V2 penetrate the IMD layer 30 and expose a part of the etching stop layer 20 before the step of transferring the first aperture V1 and the second aperture V2 to the etching stop layer 20, but not limited thereto. A semiconductor structure 100 shown in FIG. 10 may be obtained by the fabricating method described above.

It is worth noting that, in other embodiments of the present invention, a part of the first barrier layer 73 may remain in the first aperture V1 during the step of etching the etching stop layer 20. Therefore, a part of the first barrier layer 73 may remain on the sidewalls of the first aperture V1 and there is no barrier layer remaining in the second aperture V2.

Figure 11:
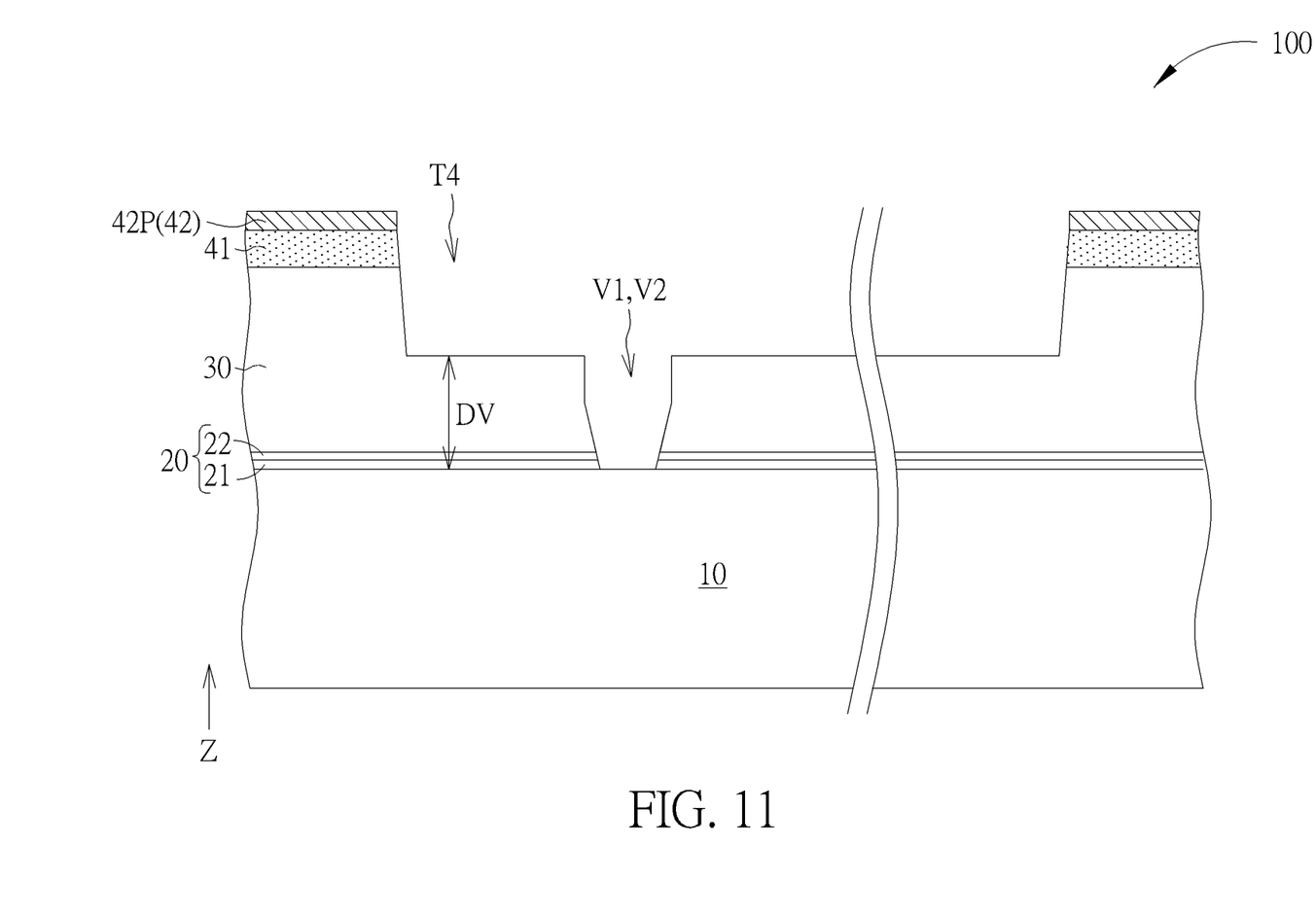
FIG. 11 is a schematic drawing illustrating the semiconductor structure according to the first embodiment of the present invention.

Please refer to FIG. 10 and FIG. 11. FIG. 11 is a schematic drawing illustrating the semiconductor structure 100 in this embodiment. Specifically, FIG. 11 may be regarded as a cross-sectional diagram taken along a cross-sectional line parallel to an extending direction of the fourth trench T4. The first aperture V1 and the second aperture V2 may be formed corresponding to conductive plugs (not shown) electrically connected to the parts of the MOS in the semiconductor substrate 10, such as the gate structure and/or the source/drain regions, but not limited thereto. A distance DV between the bottom of the fourth trench T4 and the surface of the semiconductor substrate 10 may be regarded as a depth of the first aperture V1 and the second aperture V2. The fourth trenches T4, the first aperture V1, and the second aperture V2 may be filled with conductive materials such as copper (Cu), tungsten (W), or aluminum (Al) so as to form conductive lines and contact via respectively.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 12:
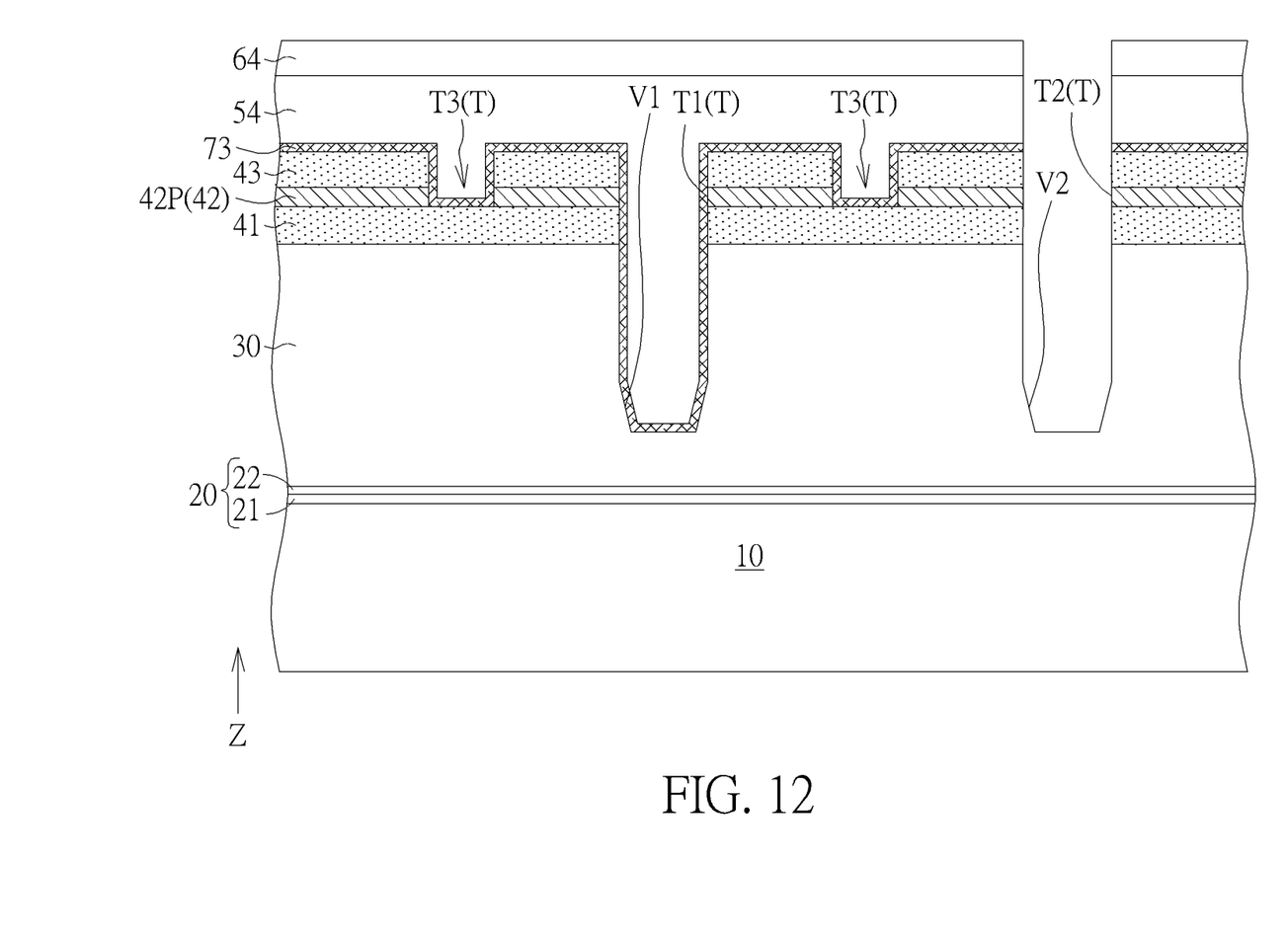
FIG. 12 is a schematic drawing illustrating a method of fabricating a semiconductor structure according to a second embodiment of the present invention.

Please refer to FIG. 12. FIG. 12 is a schematic drawing illustrating a method of fabricating a semiconductor structure according to a second embodiment of the present invention. As shown in FIG. 12, the difference between the method of this embodiment and the method of the above-mentioned first embodiment is that the first aperture V1 and the second aperture V2 do not penetrate the IMD layer 30 before the step of transferring the first aperture V1 and the second aperture V2 to the etching stop layer 20. In other words, the first aperture V1 and the second aperture V2 may stop in the IMD layer 30 without exposing the etching stop layer 20 before the step of transferring the first aperture V1 and the second aperture V2 to the etching stop layer 20. Accordingly, the dimension of the first aperture V1 and the second aperture V2 in the etching stop layer 20 may be controlled more precisely especially when the etching selectivity between the IMD layer 30 and the etching stop layer 20 is relatively low.

To summarize the above descriptions, in the method of fabricating the semiconductor structure of the present invention, the barrier layers are used to cover exposed material layers before the step of forming the patterned resist. Therefore, the patterned resist for forming trenches and/or apertures may be kept from being poisoned and/or contaminated by the compositions such as nitrogen in the material layers. The critical dimension control of the trenches and/or the apertures in the semiconductor structure may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor structure, comprising:
    forming an inter metal dielectric (IMD) layer on a semiconductor substrate;
    forming a patterned hard mask layer on the IMD layer;
    forming a first aperture in the IMD layer;
    forming a first barrier layer on the patterned hard mask layer and a surface of the first aperture;
    forming a first patterned resist on the first barrier layer;
    forming a first bottom anti-reflection coating (BARC) on the first barrier layer before the step of forming first patterned resist, wherein the first aperture is filled with the first barrier layer and the first BARC, and the first patterned resist is formed on the first BARC; and
    performing an etching process to form a second aperture in the IMD layer by using the first patterned resist as a mask, wherein the second aperture is separated from the first aperture.

2. The method of claim 1, wherein the first barrier layer is conformally formed on the patterned hard mask layer and the surface of the first aperture.

3. The method of claim 1, wherein the first barrier layer covers the patterned hard mask layer and the first aperture during the step of forming the first BARC, the step of forming the first patterned resist, and the etching process for forming the second aperture.

4. The method of claim 1, further comprising:
forming a cap layer on the patterned hard mask layer before the step of forming the first aperture; and
forming a sacrifice layer between the IMD layer and the patterned hard mask layer, wherein the first aperture penetrates the sacrifice layer, and the first barrier layer is formed conformally on the cap layer, the patterned hard mask layer, the sacrifice layer, and the surface of the first aperture.

5. The method of claim 4, further comprising:
removing the cap layer and the first barrier layer after the step of forming the second aperture.

6. The method of claim 1, further comprising:
forming an etching stop layer on the semiconductor substrate before the step of forming the IMD layer, wherein the IMD layer is formed on the etching stop layer; and
transferring the first aperture and the second aperture to the etching stop layer.

7. The method of claim 6, wherein the first aperture and the second aperture penetrate the IMD layer and expose a part of the etching stop layer before the step of transferring the first aperture and the second aperture to the etching stop layer.

8. The method of claim 6, wherein the first aperture and the second aperture do not penetrate the IMD layer before the step of transferring the first aperture and the second aperture to the etching stop layer.

9. The method of claim 1, wherein the first barrier layer comprises a nitrogen-free material layer.

10. The method of claim 9, wherein the first barrier layer comprises nitrogen-free oxide.

11. The method of claim 1, wherein the patterned hard mask layer comprises a plurality of trenches, the first aperture is formed corresponding to a portion of one of the trenches, and the second aperture is formed corresponding to a portion of another one of the trenches.

12. The method of claim 11, wherein the step of forming the patterned hard mask layer comprises:
forming a hard mask layer on the semiconductor substrate;
forming a cap layer on the hard mask layer;
forming a plurality of first openings in the cap layer, wherein the first openings expose a part of the hard mask layer;
forming a plurality of second openings in the cap layer after the step of forming the first openings, wherein the second openings expose another part of the hard mask layer; and
transferring the first openings and the second openings to the hard mask layer for forming a plurality of the trenches.

13. The method of claim 12, wherein the step of forming the second openings comprises:
forming a second barrier layer conformally on the cap layer and the hard mask layer exposed by the first openings;
forming a second bottom anti-reflection coating (BARC) on the second barrier layer;
forming a second patterned resist on the second BARC; and
forming the second openings by using the second patterned resist as a mask.

14. The method of claim 13, wherein the second barrier layer covers the cap layer and the hard mask layer exposed by the first openings during the step of forming the second BARC, the step of forming the second patterned resist, and the step of forming the second openings.

15. The method of claim 13, wherein the second barrier layer comprises a nitrogen-free material layer.

\* \* \* \* \*